United States Patent [19]
Hirai et al.

[11] Patent Number: 5,360,110
[45] Date of Patent: Nov. 1, 1994

[54] COMPONENT CONTAINER

[75] Inventors: Hiroyuki Hirai, Habikino; Kuninori Takezawa, Kofu, both of Japan

[73] Assignee: Matsushita Electric Industrial Co., Ltd., Osaka, Japan

[21] Appl. No.: 944,443

[22] Filed: Sep. 14, 1992

[51] Int. Cl.$^5$ .............................................. B65D 73/02
[52] U.S. Cl. ................................. 206/330; 206/332; 206/464; 206/465
[58] Field of Search ............... 206/330, 332, 464, 465, 206/477, 480, 482

[56] References Cited

U.S. PATENT DOCUMENTS

| | | | |
|---|---|---|---|
| 4,508,225 | 4/1985 | Ferrari | 206/477 |
| 4,633,370 | 12/1986 | Hamuro et al. | 206/330 |
| 4,981,212 | 1/1991 | Lutz et al. | 206/465 |
| 5,132,160 | 7/1992 | Bird | 206/332 |
| 5,136,827 | 8/1992 | Sawaya | 206/330 |

FOREIGN PATENT DOCUMENTS

| | | | |
|---|---|---|---|
| 662471 | 5/1963 | Canada | 206/465 |
| 3212368 | 9/1991 | Japan | 206/330 |
| 457776 | 2/1992 | Japan | 206/330 |

*Primary Examiner*—David T. Fidei
*Attorney, Agent, or Firm*—Wenderoth, Lind & Ponack

[57] ABSTRACT

A component container includes a carrier tape and a package. The carrier tape has a plurality of openings formed on a flexible tape-shaped transporting material at predetermined intervals, a first fixing through-hole formed forward of each opening, and a second fixing through-hole formed backward of the opening. Each of the fixing through-holes is formed separately from each opening. The package is inserted into each of the openings of the carrier tape and has a component-accommodating recess, a first fixing portion securely inserted through the first fixing through-hole of the carrier tape so as to be allowed to move in the first fixing through-hole in a longitudinal direction of the carrier tape, and a second fixing portion securely inserted through the second fixing through-hole of the carrier tape.

3 Claims, 8 Drawing Sheets

COMPONENT CONTAINER

BACKGROUND OF THE INVENTION

The present invention relates to a component container for accommodating an electronic component or a mechanical component.

An example of a conventional component container for accommodating an electronic component or a mechanical component is described below with reference to FIGS. 15 through 17.

A component container 51 comprises a carrier tape 53 having a plurality of rectangular openings 52 formed therethrough at predetermined intervals, and a package 55 made of synthetic resin, securely inserted into each opening 52 of the carrier tape 53 and having a component-accommodating recess 54.

The package 55 is securely fixed to the carrier tape 53 by means of flanges 56 thereof and fixing portions 58 thereof. The fixing portions 58 are disposed on the carrier tape 53 and are continuous with the flanges 56 via through-holes 57 formed at four corners of the carrier tape 53. That is, the carrier tape 53 is sandwiched between the flanges 56 and the fixing portions 58.

A mold is used to form the component container 51 having the above-described construction.

The component-accommodating recess 54 is covered with a cover tape (not shown) so as to prevent the component accommodated therein from falling therefrom. The component is supplied to a predetermined component-mounting place via feeding openings 53a formed along both edges of the carrier tape 53.

The construction of the above-described component container has the following disadvantages.

The fixing portions 58 of the package 55 and the through-holes 57 of the carrier tape 53 are securely fixed to each other. Therefore, when resin composing the package 55 contracts according to the contraction coefficient thereof due to a temperature drop from a high temperature to room temperature, the carrier tape 53 is flexed due to the contraction of the package 55, as shown in FIG. 17.

SUMMARY OF THE INVENTION

It is an object of the present invention to provide a component container in which a carrier tape is not flexed, even though a package contracts.

In accomplishing these and other objects, according to one aspect of the present invention, there is provided a component container comprising a carrier tape having a plurality of openings formed on a flexible tape-shaped transporting material at predetermined intervals, a first fixing through-hole formed forward of each opening, and a second fixing through-hole formed backward of the opening. Each of the fixing through-holes is formed separately from each opening; and a package, inserted into each of the openings of the carrier tape and has a component-accommodating recess, a first fixing portion securely inserted through the first fixing through-hole of the carrier tape allowed to move in the first fixing through-hole in a longitudinal direction of the carrier tape, and a second fixing portion securely inserted through the second fixing through-hole of the carrier tape.

BRIEF DESCRIPTION OF THE DRAWINGS

These and other objects and features of the present invention will become clear from the following description of the preferred embodiments thereof with reference to the accompanying drawings, in which.

DETAILED DESCRIPTION OF THE INVENTION

Figure 1:
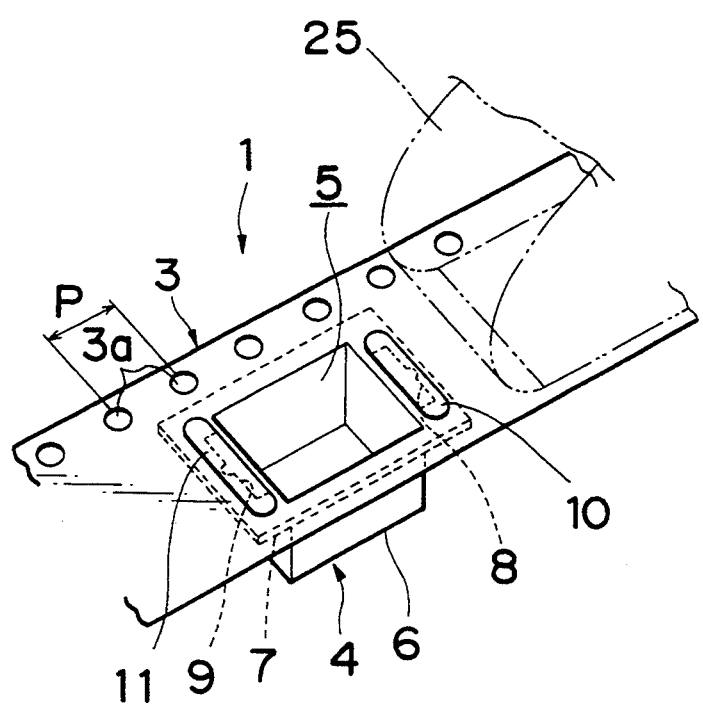
FIG. 1 is a perspective view showing a component container according to a first embodiment of the present invention.
Figure 2:
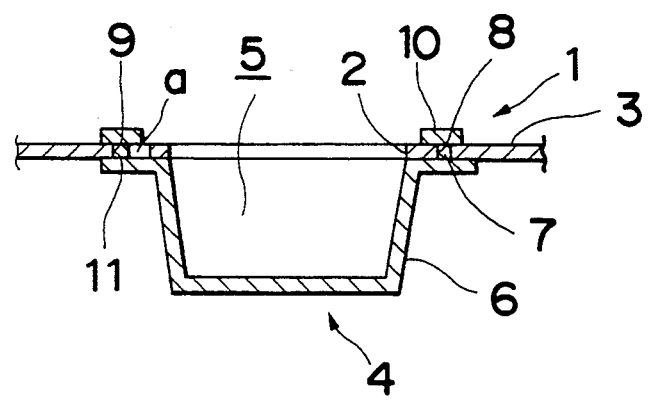
FIG. 2 is a cross-sectional view of the component container of FIG. 1.

Before the description of the present invention proceeds, it is to be noted that like parts are designated by like reference numerals throughout the accompanying drawings.

A component container according to a first embodiment of the present invention is described below with reference to FIGS. 1 through 8.

Referring to FIG. 1, a component container 1 comprises a carrier tape 3 made of synthetic resin and having a plurality of rectangular openings 2 (refer to FIG. 2) spaced at predetermined intervals, and a plurality of component-accommodating packages 4 each made of hard synthetic resin and fixed to the opening 2 of the carrier tape 3. The package 4 comprises a package main body 6 having a component-accommodating recess 5, a flange 7 projecting outward from the upper end of the package main body 6, a fixing portion 10 (fixed side) disposed on the carrier tape 3 continuous with the flange 7 through a through-hole 8, and a fixing portion 11 (movable side) disposed on the carrier tape 3 and continuous with the flange 7 through a through-hole 9. The through-holes 8 and 9 are symmetrical with respect to the center line of the package main body 6 in the crosswise direction of the carrier tape 3 and are formed separately from the opening 2. The fixing portions 10 and 11 are located on the forward and backward sides of the recess 5 in a transfer direction.

The method for fixing the package 4 to the carrier tape 3 is described below.

Figure 3:
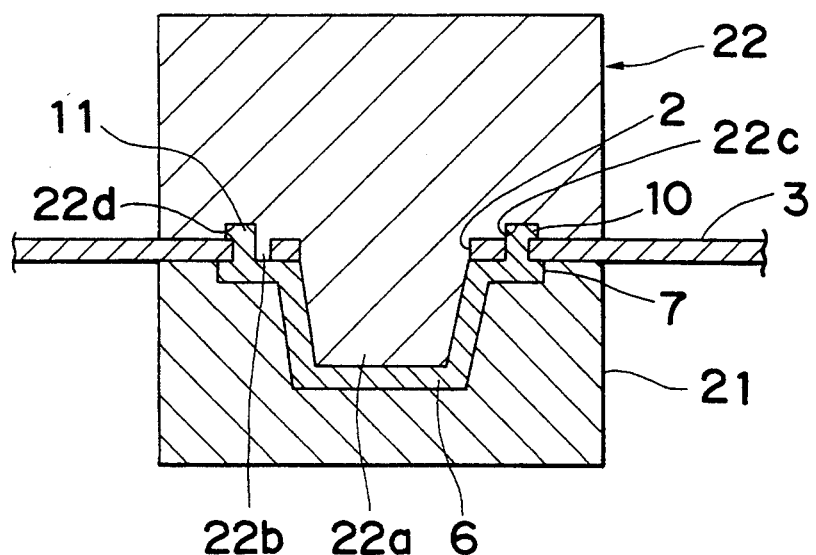
FIG. 3 is a sectional view showing a mold for molding a material into the component container of FIG. 1.

As shown in FIG. 3, a lower mold 21 and an upper mold 22 are superimposed on each other with the carrier tape 3 so that a molding portion of the carrier tape 3, including the opening 2, is sandwiched therebetween.

The configuration of the lower mold 21 corresponds to that of the lower portion of the package 4. The upper mold 22 comprises a projection 22a corresponding to the recess 5 of the package 4. Recesses 22c and 22d correspond to the fixing portions 10 and 11, respectively. A projection 22b, corresponding to a gap (a) in FIG. 2, projects alongside of the recess 22d. The gap (a) is formed to allow the fixing portion 11 to move in the through-hole 9 in the longitudinal direction of the carrier tape 3.

Accordingly, the injection of synthetic resin into the lower mold 21 and the upper mold 22 forms the component container 1 comprising the carrier tape 3 and the package 4 having the component-accommodating recess 5 and integrally fixed to the carrier tape 3.

Figure 4:
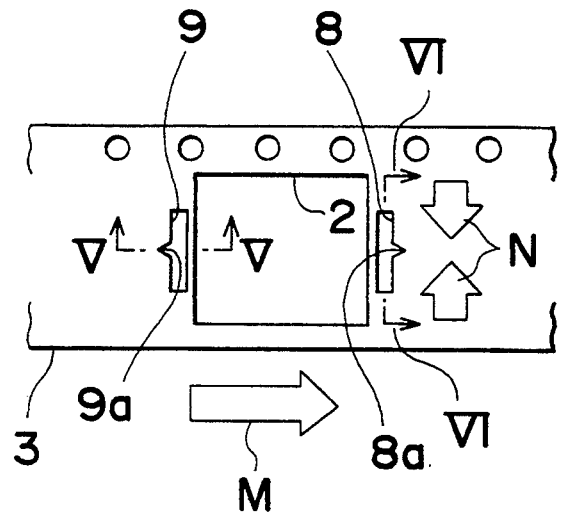
FIG. 4 is a plan view describing the state of the contraction of a package of the component container of FIG. 1 that occurs when the component container is formed.
Figure 5:
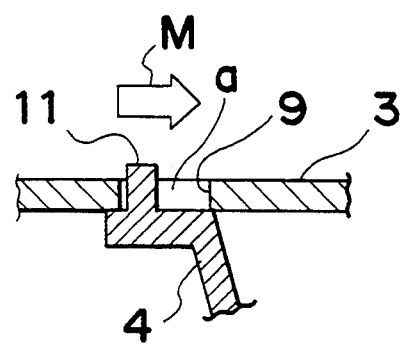
FIG. 5 is a sectional view taken along a line V—V of FIG. 4.

As shown in FIG. 3, when the mold is removed from the component container 1 formed by injection molding, a space is formed corresponding to the volume of the projection 22b. The space has a distance more than or equal to the amount of contract of the resin, that is, the amount allowed for movement of the package 4 rightward in FIG. 3 by contraction of the resin. Therefore, even though resin contracts according to its contraction coefficient due to a temperature drop from a high temperature to room temperature, the through-hole 9 has a degree of freedom in the direction toward the through-hole 8, shown by arrow (M) as shown in FIGS. 4 and 5. Thus, the carrier tape 3 is not flexed by the contraction of the package 4.

The through-hole 8 is slit-shaped in the width direction of the carrier tape 3 and separated from the opening 2. When the package 4 contracts, the fixing portion 11 moves in the (M)-direction of FIGS. 4 and 5 while the fixing portion 10 is stationary. As a result, the carrier tape 3 is not flexed in the longitudinal direction thereof.

Figure 6:
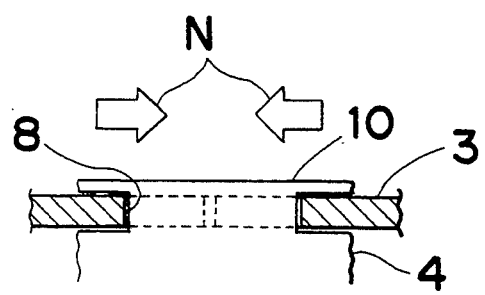
FIG. 6 is a sectional view taken along a line VI—VI of FIG. 4.

Narrow grooves 8a and 9a are formed in the center of each through-hole 8 and 9 in the width direction of the carrier tape 3 so as to prevent the carrier tape 3 from being flexed by the contraction of the package 4 in the width direction of the carrier tape 3, as shown by arrows (N) in FIGS. 4 and 6. Therefore, the posture of the component accommodated in the recess 5 of the package 4 can be maintained. The size of each groove 8 and 9 is sufficiently small, preferably.

Referring to FIG. 1, the packages 4 are secured to the carrier tape 3 at predetermined intervals and feeding holes 3a are formed at predetermined intervals (P) along an edge of the carrier tape 3. It is possible to form the feeding holes 3a along both edges of the carrier tape 3. A cover tape 25 is attached to the carrier tape 3 so as to prevent the component from falling from the recess 5 of the package 4. The width of the cover tape 25 is smaller than that of the carrier tape 3 and greater than that of the opening 2 of the package 4.

Figure 7:
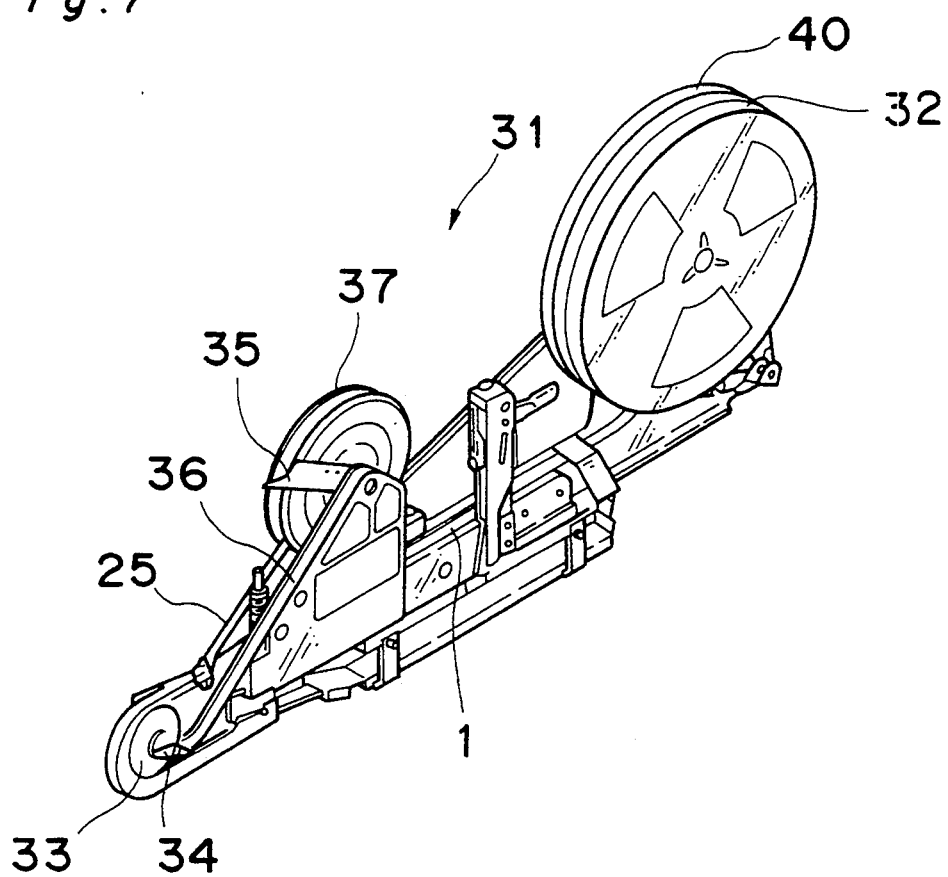
FIG. 7 is a perspective view showing a component supply apparatus for supplying the component container of FIG. 1 to a component-mounting apparatus.
Figure 8:
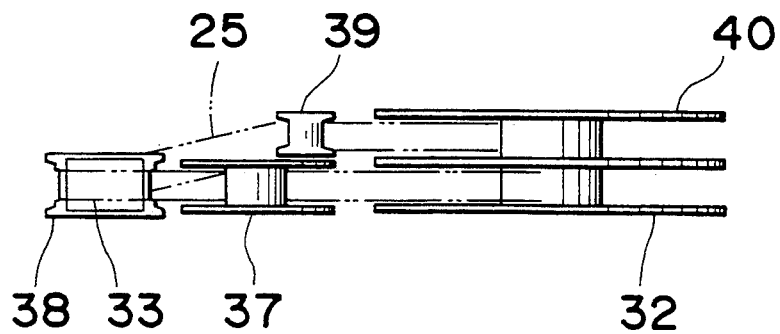
FIG. 8 is a partial plan view showing the component supply apparatus of FIG. 7.
Figure 9:
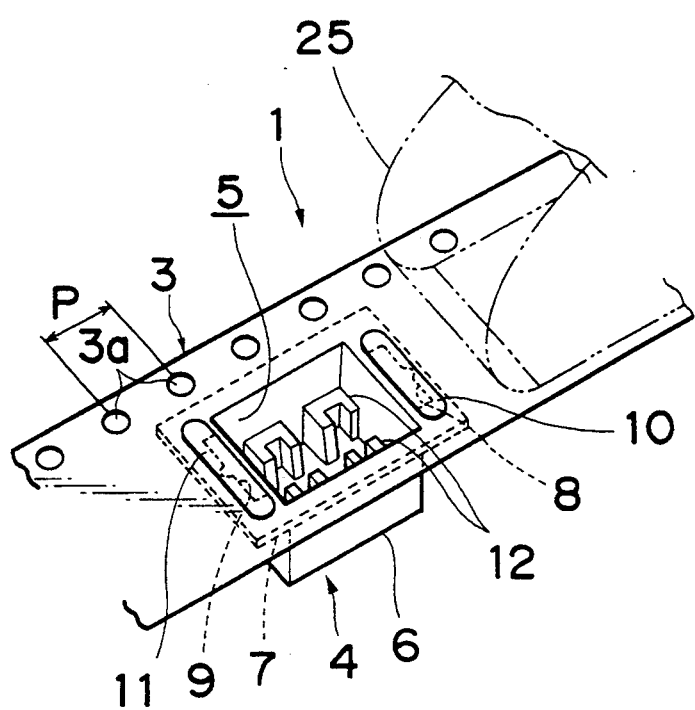
FIG. 9 is a perspective view showing a component container according to a second embodiment of the present invention.

A component supply apparatus 31 as shown in FIG. 7 supplies a mechanical component to a component-mounting place as follows by using the component container 1 of the above-described construction.

The component container 1, wound round a feeding reel 32, is fed out therefrom at the predetermined interval (P) by a driving section comprising a wheel 33, a ratchet 33, a lever 35, and a link 36. Immediately before the component container 1 passes the wheel 33, a cover-collecting reel 37 removes the cover tape 25 from the carrier tape 3 so that the component can be taken out therefrom. Immediately after the component container 1 passes the wheel 33, a guide roller 38 provided adjacently to the wheel 33 guides the carrier tape 3 to restrict the winding angle and position so that a great area of the carrier tape 3 is not wound around the wheel 33. Therefore, even though the component container 1 accommodates a large component and the interval (P) between the adjacent feeding holes 3a of the carrier tape 3 is great, adjacent packages 4 do not interfere with each other.

After the component container 1 passes the guide roller 38, the component container 1 is wound around a collecting reel 40 through a guide roller 39.

As described above, each through-hole of the carrier tape is formed separately from the opening thereof for fixing the package thereto and the fixing portion of the package disposed on one side of the component container is capable of moving in the through-hole in the longitudinal direction of the carrier tape. Therefore, when the package contracts due to a temperature drop from a high temperature to the room temperature, the carrier tape is not flexed and the package can be prevented from dropping from the carrier tape. In addition, when the fixing portion on one side moves by the contraction of the package, the package remains placed in position because the package is secured to the carrier tape by the other fixing portion disposed on the other side of the component container.

A second embodiment of the present invention is described below with reference to FIGS. 9 through 14.

In the second embodiment, the package main body 6 accommodates holding portions 12 for holding a plurality of components. In order to securely attach the package 4 to the carrier tape 3, recess portions (not shown) corresponding to the holding portions 12 are formed on the projection 22a of the upper mold 22.

Accordingly, the injection of synthetic resin into the lower mold 21 and the upper mold 22 forms the component container 1 comprising the carrier tape 3 and the package 4 having the holding portions 12 capable of holding a plurality of components and fixed to the carrier tape 3.

Figure 10:
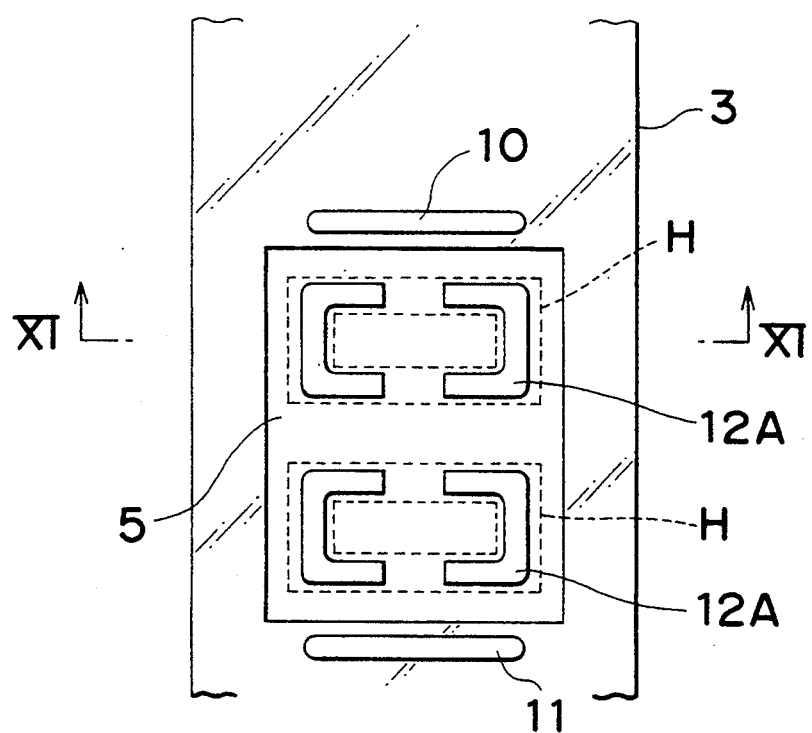
FIG. 10 is a plan view showing holding portions of the component container of FIG. 9.
Figure 11:
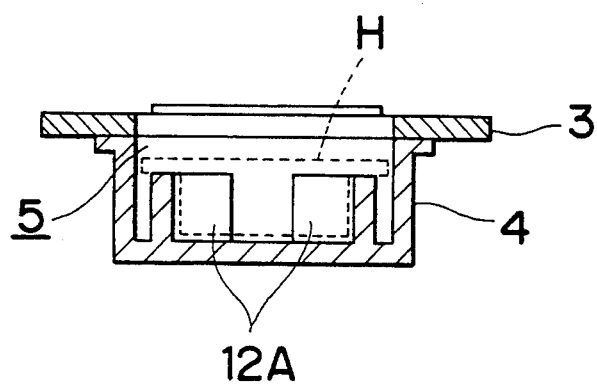
FIG. 11 is a sectional view taken along a line XI—XI of FIG. 10.
Figure 12:
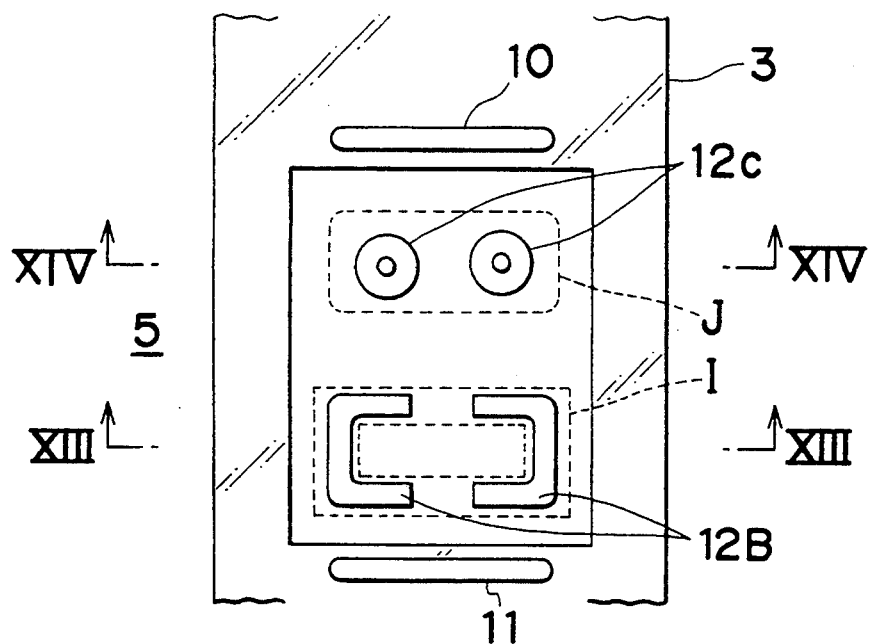
FIG. 12 is a plan view showing a modification of the holding portions of the component container of FIG. 9.
Figure 13:
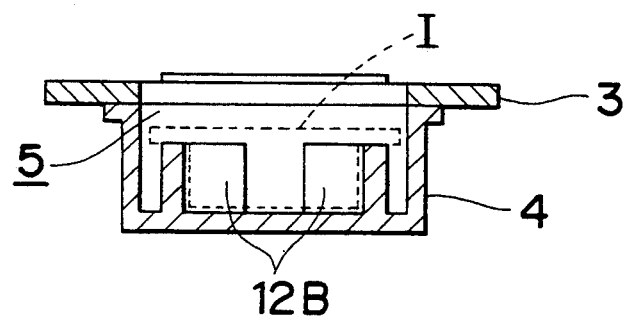
FIG. 13 is a sectional view taken along a line XIII—XIII of FIG. 12.
Figure 14:
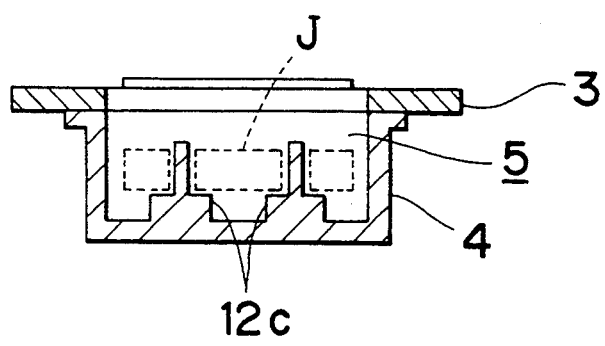
FIG. 14 is a sectional view taken along a line XIV—XIV of FIG. 12.
Figure 15:
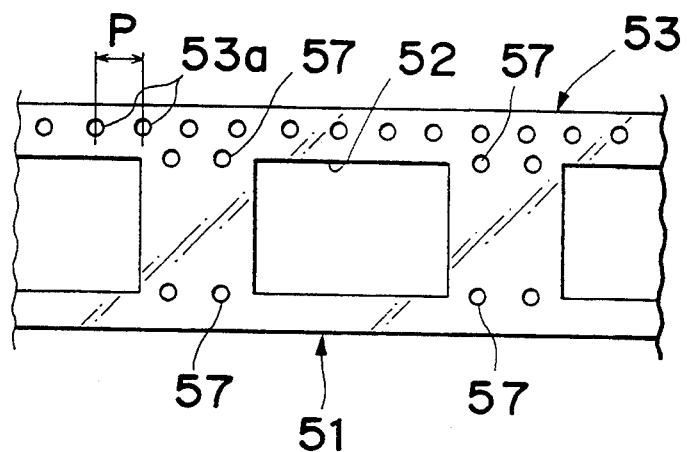
FIG. 15 is a perspective view showing a conventional component container.
Figure 16:
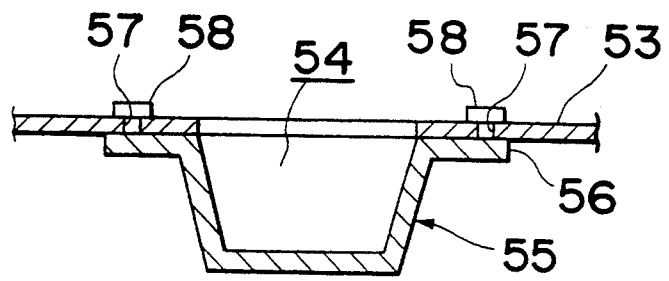
FIG. 16 is a side elevation showing the conventional component container of FIG. 15.
Figure 17:
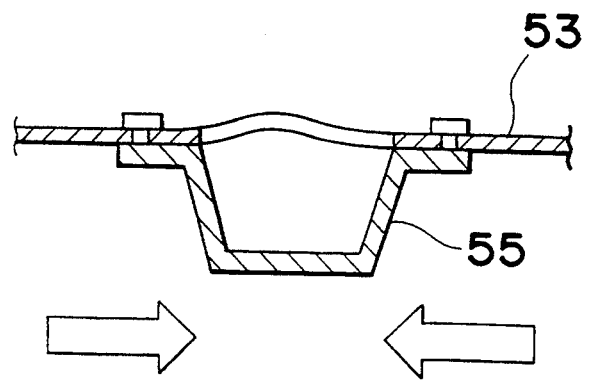
FIG. 17 is a sectional view for describing the operation of the conventional component container of FIG. 15.

FIGS. 10 and 11 show holding tools 12A for holding the same kind of components (H). FIGS. 12 through 14 show holding tools 12B and 12C for holding different kinds of components (I) and (J).

According to the second embodiment of the present invention, a plurality of components can be held in one package. Therefore, the component container can be manufactured in a shorter period of time, at a lower cost, and efficiently. That is, since the holding portions can hold a plurality of components in one package, the number of packages to be manufactured can be reduced and thus the amount of time used for forming them can be saved. In addition, since a plural number or a plural kind of components can be simultaneously supplied to a predetermined place of an equipment, a series of operations for mounting components on a substrate can be performed efficiently and in a shorter period of time.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component container, comprising:
   a carrier tape comprising a flexible transporting material in the form of a tape having a longitudinal direction, a plurality of openings therein at predetermined intervals, a first fixing through-hole forward of each of said openings, and a second fixing through-hole rearward of each of said openings, wherein each of said first and second fixing through-holes are separate from each of said openings; and
   a package inserted into each of said openings, of said carrier tape, each package defining a component accommodating recess therein and having a first fixing portion extending through said first fixing through-hole of a respective one of said openings of said carrier tape so as to be movable in said longitudinal direction of said carrier tape in said first fixing through-hole, and a second fixing portion extending through said second fixing through-hole of the respective one of said openings of said carrier tape.

2. The component container of claim 1, wherein each first fixing through-hole is defined by a first portion of said flexible transporting material forward of the respective one of said openings and a second portion of said flexible transporting material forward of said first fixing through-hole so that said first fixing through-hole has a width in said longitudinal direction larger than the width of said first fixing portion in said first fixing through-hole in said longitudinal direction, whereby said first fixing portion is movable in said longitudinal direction and said first and second portions of said flexible transport material define the range of movement of said first fixing portion.

3. The component container of claim 1, wherein at least one said package has a plurality of component holding portions in said component accommodating recess.

* * * * *